United States Patent
Lu et al.

(10) Patent No.: US 7,727,903 B2
(45) Date of Patent: Jun. 1, 2010

(54) METHOD OF FORMING STRAIN-CAUSING LAYER FOR MOS TRANSISTORS AND PROCESS FOR FABRICATING STRAINED MOS TRANSISTORS

(75) Inventors: Huo-Tieh Lu, Taipei (TW); Jin-sheng Yang, Hsinchu (TW); Pei-Lin Kuo, Taichung (TW)

(73) Assignee: United Microelectronics Corp., Hsinchu (TW)

( * ) Notice: Subject to any disclaimer, the term of this patent is extended or adjusted under 35 U.S.C. 154(b) by 42 days.

(21) Appl. No.: 11/926,852

(22) Filed: Oct. 29, 2007

(65) Prior Publication Data

US 2009/0111272 A1 Apr. 30, 2009

(51) Int. Cl.
*H01L 21/31* (2006.01)
(52) U.S. Cl. .......................................... 438/761
(58) Field of Classification Search ........................ None
See application file for complete search history.

(56) References Cited

U.S. PATENT DOCUMENTS

| | | | |
|---|---|---|---|
| 5,342,478 A * | 8/1994 | Welbourn ..................... 216/24 |
| 2006/0091471 A1* | 5/2006 | Frohberg et al. ............. 257/369 |
| 2008/0020591 A1* | 1/2008 | Balseanu et al. ............. 438/761 |
| 2008/0054314 A1* | 3/2008 | Frohberg et al. ............. 257/288 |

* cited by examiner

*Primary Examiner*—Charles D Garber
*Assistant Examiner*—Andre' C Stevenson
(74) *Attorney, Agent, or Firm*—Chun-Ming Shih

(57) ABSTRACT

A method of forming a strain-causing layer for MOS transistors is provided, which is applied to a substrate having a plurality of gate structures of the MOS transistors thereon. A non-conformal stressed film that is thicker on the gate structures than between the gate structures is formed over the substrate. The non-conformal stressed film is then etched, without an etching mask thereon, to remove portions thereof between the gate structures and disconnect the stressed film between the gate structures. At least one extra stressed film may be further formed over the substrate, wherein each extra stressed film has the same type of stress as the above stressed film and is connected or disconnected between the gate structures.

23 Claims, 3 Drawing Sheets

METHOD OF FORMING STRAIN-CAUSING LAYER FOR MOS TRANSISTORS AND PROCESS FOR FABRICATING STRAINED MOS TRANSISTORS

BACKGROUND OF THE INVENTION

1. Field of Invention

This invention relates to a semiconductor process, and more particularly relates to a method of forming a strain-causing layer for MOS transistors and a process for fabricating strained MOS transistors.

2. Description of Related Art

As the linewidth of semiconductor device is much reduced and the requirement on the device speed increasingly gets higher, the strained-silicon technology is provided. In a metal-oxide-semiconductor (MOS) process utilizing the strained-silicon technology in the prior art, a stressed film is formed over the MOS transistors to cause strains in the channels regions thereof.

FIG. 1 illustrates a conventional stressed film for MOS transistors, wherein each transistor is based on a semiconductor substrate 100 and includes a gate structure 110. When the MOS transistors are NMOS transistors with n-type S/D regions 105, a tensile-stressed film 120 is formed over them. When the transistors are PMOS transistors with p-type S/D regions 105', a compressive-stressed film 120' is formed over them.

However, because the conventional stressed film 120/120' is connected between two neighboring gate structures 110, the stresses for the two transistors counteract each other thereat, as indicated by the pair of opposite arrows, so that the strain caused is reduced and the performances of the transistors are lowered. This issue is important especially when the distance between the two neighboring gate structures 110 is small.

SUMMARY OF THE INVENTION

Accordingly, this invention provides a method of forming a strain-causing layer for MOS transistors.

This invention also provides a process for forming strained MOS transistors, which is based on the method of forming a strain-causing layer of this invention.

The method of forming a strain-causing layer of this invention is described below. A substrate with a plurality of gate structures of MOS transistors thereon is provided. A non-conformal stressed film that is thicker on the gate structures than between the gate structures is formed over the substrate. The non-conformal stressed film is etched, without an etching mask thereon, to remove portions thereof between the gate structures and disconnect the stressed film between the gate structures.

In an embodiment of the above method, at least one extra stressed film may be further formed over the substrate, wherein each extra stressed film has the same type of stress as the stressed film and is connected or disconnected between the gate structures.

The process for forming strained MOS transistors of this invention is based on the above method of forming a strain-causing layer. After the strain-causing layer is formed, a dielectric layer is formed over the substrate covering the stressed film.

Since the strain-causing layer (or at least the first stressed film in a strain-causing layer of multiple stressed films in an embodiment of this invention) is disconnected between the gate structures, the stresses for two neighboring transistors don't counteract each other so that the strains caused in the transistor channel regions are increased and the performances of the transistors are improved as compared with the prior art.

It is to be understood that both the foregoing general description and the following detailed description are exemplary, and are intended to provide further explanation of the invention as claimed.

DESCRIPTION OF EMBODIMENTS

Figure 1:
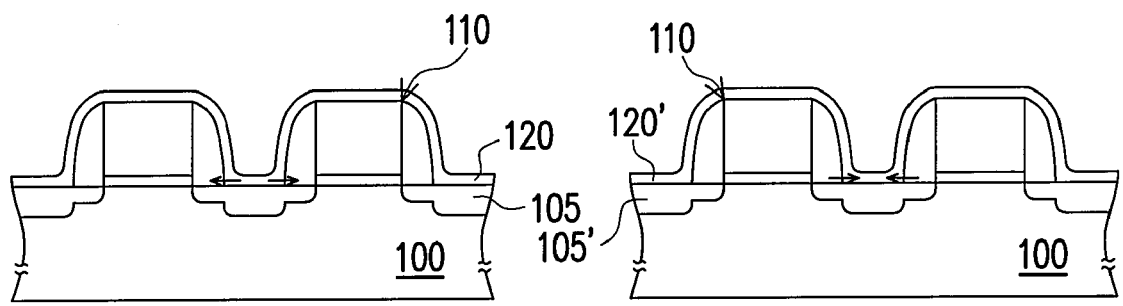
FIG. 1 illustrates a conventional stressed film for MOS transistors.
Figure 2A:
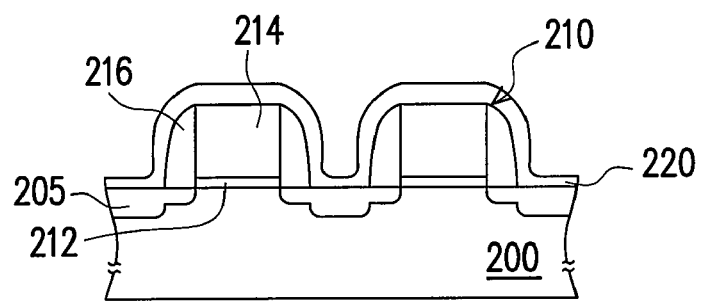
FIGS. 2A-2B illustrate a process for forming strained MOS transistors according to a first embodiment of this invention, wherein a method of forming a strain-causing layer for MOS transistors according to the first embodiment is also shown.
Figure 2B:
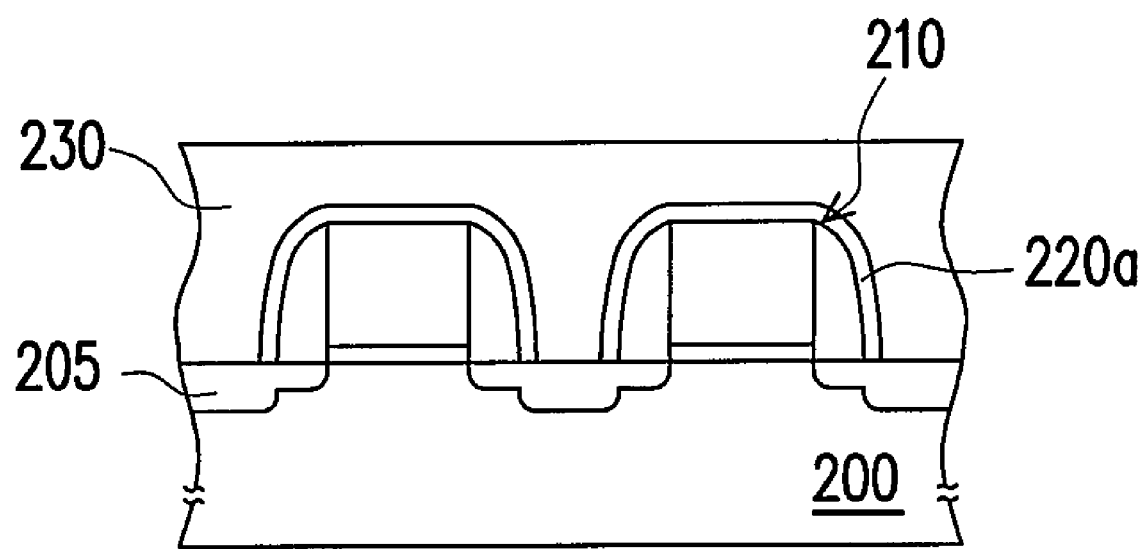

FIGS. 2A-2B illustrate a process for forming strained MOS transistors according to a first embodiment of this invention, wherein a method of forming a strain-causing layer for MOS transistors according to the first embodiment is also shown.

Referring to FIG. 2A, a semiconductor substrate 200 having a plurality of gate structures 210 of MOS transistors thereon is provided, wherein the material of the substrate 200 may be single-crystal silicon or SiGe. A gate structure 210 may include a gate dielectric film 212, a gate 214 on the gate dielectric film 212 and a spacer 216 on the sidewall of the gate 214, wherein the gate 214 may include doped polysilicon. The S/D regions 205 of the MOS transistors have also been formed in the substrate 200.

Then, a non-conformal stressed film 220 that is thicker on the gate structures 210 than between the gate structures 210 is formed. When the MOS transistors are NMOS transistors with n-type S/D regions 205, the stressed film 220 is a tensile-stressed one; when the transistors are PMOS transistors with p-type S/D regions 205, the stressed film 220 is a compressive-stressed one. In addition, the material of the non-conformal stressed film 220 may be silicon nitride. A deposition recipe allowing formation of a non-conformal stressed film thicker at specific portions can be found in the prior art, and is thus not exemplified here.

Moreover, an etching stop layer may be formed over the substrate 200 before the non-conformal stressed film 220 is formed for protecting the substrate 200 in the later etching step. As the material of the non-conformal stressed film 220 is silicon nitride, the material of the etching stop layer may be silicon oxide, for example.

Referring to FIG. 2B, the non-conformal stressed film 220 is etched without an etching mask thereon, wherein the etching is preferably anisotropic etching for the sake of controllability. Since the non-conformal stressed film 220 (FIG. 2A) is thicker on the gate structures 210 than between the gate structures 210, portions thereof on the gate structures 210 remains as portions thereof between the gate structures 210 are removed, thus disconnecting the stressed film 220 between the gate structures 210 while thinning the stressed film 220 on the gate structures 210 (i.e., generally partly removing the stressed film 220 on the gate structures 210 along a thicknesswise direction of the stressed film 220 as seen by comparing FIG. 2B with FIG. 2A) The stressed film 220a as a single-film strain-causing layer disconnected between the gate structures 210 may be cured in option to increase the stress thereof, wherein the curing may be UV-light curing or other type of curing. Then, an inter-layer dielectric (ILD) layer 230 is formed covering the stressed film 220a.

Moreover, after the above stressed film 220a is formed, at least one extra stressed film may be further formed over the substrate 200, wherein each extra stressed film has the same type of stress as the stressed film 220a and is connected or disconnected between the gate structures 210. When the stressed film is tensile- or compressive-stressed, the at least one extra stressed film is also tensile- or compressive-stressed. The stressed film 220a and the at least one extra stressed film constitute a multi-film strain-causing layer. In addition, the stressed film 220a and the extra stressed film(s) may all include silicon nitride. Two such embodiments are described below.

Figure 3:
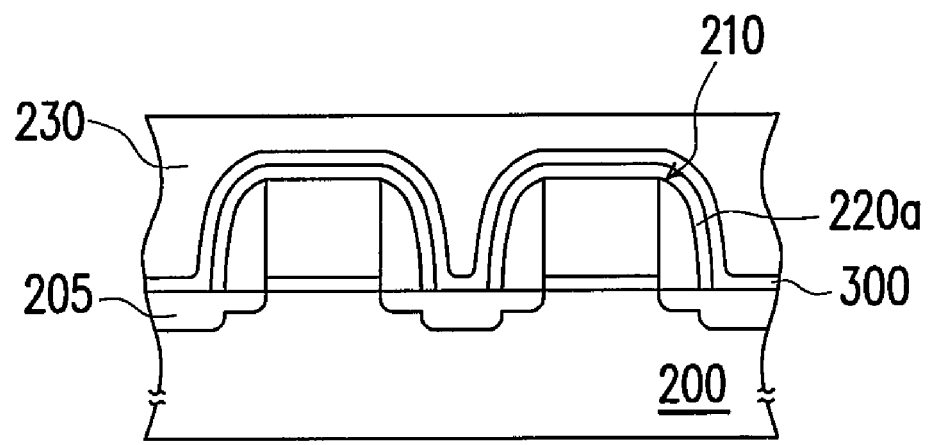
FIG. 3 illustrates a later part of a process for forming strained MOS transistors according to a second embodiment of this invention.

FIG. 3 illustrates a later part of a process for forming strained MOS transistors according to a second embodiment of this invention.

Referring to FIG. 3, after the stressed film 220a is formed, an extra stressed film 300 is formed over the substrate 200 covering the gate structures 210 and the stressed film 220a. The extra stressed film 300 has the same type of stress as the stressed film 220a but is connected between the gate structures 210. Thereafter, an ILD layer 230 is formed covering the resulting structures.

In the second embodiment, the non-continuous stressed film 220a and the extra stressed film 300 connected between the gate structures 210 together constitute a strain-causing layer. The stressed film 220a and the extra stressed film 300 are both tensile-stressed films in cases of NMOS transistors or both compressive-stressed films in cases of PMOS transistors, and may both include silicon nitride.

Figure 4:
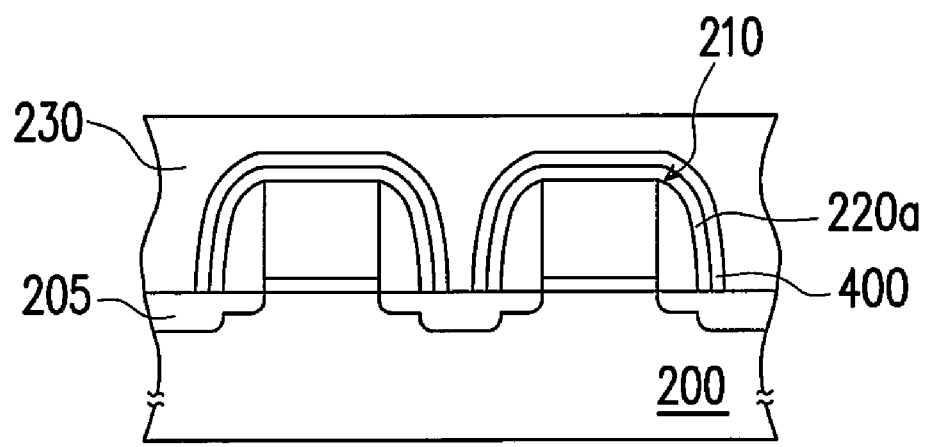
FIG. 4 illustrates a later part of a process for forming strained MOS transistors according to a third embodiment of this invention.

FIG. 4 illustrates a later part of a process for forming strained MOS transistors according to a third embodiment of this invention.

Referring to FIG. 4, after the stressed film 220a is formed, an extra stressed film 400 is formed covering the gate structures 210 and the stressed film 220a. The extra stressed film 400 has the same type of stress as the stressed film 220a, and is also disconnected between the gate structures 210 like the stressed film 220a.

The extra stressed film 400 may be formed in the same manner in which the stressed film 220a is formed. Specifically, a non-conformal extra stressed film that is thicker on the gate structures 210 than between the gate structures 210 like the stressed film shown in FIG. 2A is formed over the substrate 200, and then the non-conformal extra stressed film is etched, without an etching mask thereon, to remove portions thereof between the gate structures 210 and obtain the extra stressed film 400. Then, an ILD layer 230 is formed covering the resulting structures.

In the third embodiment, the stressed film 220a and the extra stressed film 400 both disconnected between the gate structures 210 together constitute a strain-causing layer. The stressed film 220a and the extra stressed film 400 are both tensile-stressed films in cases of NMOS transistors or compressive-stressed films in cases of PMOS transistors, and may both include silicon nitride.

Since the strain-causing layer (or at least the first stressed film in a multi-film strain-causing layer as in the second embodiment of this invention) is disconnected between the gate structures, the stresses for two neighboring transistors don't counteract each other so that the strains caused in the transistor channel regions are increased and the performances of the transistors are improved as compared with the prior art.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A method of forming a strain-causing layer for MOS transistors, applied to a substrate with a plurality of gate structures of MOS transistors thereon, and comprising:

forming over the substrate a non-conformal stressed film that is thicker on the gate structures than between the gate structures; and disconnecting the non-conformal stressed film between the gate structures and thinning the non-conformal stressed film on the gate structures, by etching applied to the whole non-conformal stressed film without using an etching mask.

2. The method of claim 1, wherein an etching stop layer is formed over the substrate before the non-conformal stressed film is formed.

3. The method of claim 1, further comprising curing the stressed film disconnected between the gate structures to increase a stress thereof.

4. The method of claim 3, wherein the curing comprises UV-light curing.

5. The method of claim 1, wherein the stressed film is a tensile-stressed film or a compressive-stressed film.

6. The method of claim 1, wherein the etching comprises anisotropic etching.

7. The method of claim 1, wherein the stressed film comprises silicon nitride.

8. The method of claim 1, further comprising:

forming at least one extra stressed film over the substrate after the stressed film is disconnected between the gate structures, wherein each extra stressed film has the same type of stress as the stressed film and is connected or disconnected between the gate structures.

9. The method of claim 8, wherein when an extra stressed film is disconnected between the gate structures, forming the extra stressed film comprises:

forming over the substrate a non-conformal extra stressed film that is thicker on the gate structures than between the gate structures; and disconnecting the non-conformal extra stressed film between the gate structures by etching applied to the whole non-conformal extra stressed film without using an etching mask.

10. The method of claim 8, wherein the stressed film and the at least one extra stressed film are tensile-stressed films or compressive-stressed films.

11. The method of claim 8, wherein the stressed film and the at least one extra stressed film comprise silicon nitride.

12. A process for forming strained MOS transistors, comprising:

providing a substrate with a plurality of gate structures of MOS transistors thereon;

forming over the substrate a non-conformal stressed film that is thicker on the gate structures than between the gate structures;

disconnecting the non-conformal stressed film between the gate structures as partly removing the non-conformal stressed film on the gate structures, by etching applied to the whole non-conformal stressed film without using an etching mask; and forming a dielectric layer over the substrate covering the stressed film.

13. The process of claim 12, further comprising forming an etching stop layer over the substrate before the non-conformal stressed film is formed.

14. The process of claim 12, further comprising curing the stressed film to increase a stress thereof, after the stressed film is disconnected between the gate structure but before the dielectric layer is formed.

15. The process of claim 14, wherein the curing comprises UV-light curing.

16. The process of claim 12, wherein the MOS transistors are NMOS transistors and the stressed film is a tensile-stressed film.

17. The process of claim 12, wherein the MOS transistors are PMOS transistors and the stressed film is a compressive-stressed film.

18. The process of claim 12, wherein the etching comprises anisotropic etching.

19. The process of claim 12, wherein the stressed film comprises silicon nitride.

20. The process of claim 12, further comprising:

forming at least one extra stressed film over the substrate after the non-conformal stressed film is disconnected between the gate structures but before the dielectric layer is formed, wherein each extra stressed film has the same type of stress as the stressed film and is connected or disconnected between the gate structures.

21. The process of claim 20, wherein when an extra stressed film is disconnected between the gate structures, forming the extra stressed film comprises:

forming over the substrate a non-conformal extra stressed film that is thicker on the gate structures than between the gate structures; and disconnecting the non-conformal extra stressed film between the gate structures by etching applied to the whole non-conformal extra stressed film without using an etching mask.

22. The process of claim 20, wherein the stressed film and the at least one extra stressed film are tensile-stressed films or compressive-stressed films.

23. The process of claim 20, wherein the stressed film and the at least one extra stressed film comprise silicon nitride.

* * * * *